US010002890B2

(12) United States Patent
Kim et al.

(10) Patent No.: US 10,002,890 B2
(45) Date of Patent: Jun. 19, 2018

(54) LIQUID CRYSTAL DISPLAY

(71) Applicant: Samsung Display Co., Ltd., Yongin-si (KR)

(72) Inventors: Hoon Kim, Ansan-si (KR); Ki Chul Shin, Seongnam-si (KR); Jae Jin Lyu, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 5 days.

(21) Appl. No.: 15/045,042

(22) Filed: Feb. 16, 2016

(65) Prior Publication Data
US 2016/0240161 A1    Aug. 18, 2016

(30) Foreign Application Priority Data

Feb. 17, 2015   (KR) .................. 10-2015-0024468

(51) Int. Cl.
G06F 3/038     (2013.01)
G09G 5/00      (2006.01)
H01L 27/12     (2006.01)
G09G 3/36      (2006.01)
G02F 1/1362    (2006.01)
G02F 1/1337    (2006.01)
G02F 1/1343    (2006.01)

(52) U.S. Cl.
CPC ...... *H01L 27/1255* (2013.01); *G02F 1/13624* (2013.01); *G09G 3/3648* (2013.01); *H01L 27/124* (2013.01); *H01L 27/1222* (2013.01); G02F 1/133707 (2013.01); G02F 2001/134345 (2013.01); G02F 2201/40 (2013.01); G09G 2300/0426 (2013.01); G09G 2300/0439 (2013.01); *G09G 2300/0447* (2013.01); *G09G 2300/0465* (2013.01); *G09G 2300/08* (2013.01); *G09G 2300/0852* (2013.01); *G09G 2300/0876* (2013.01)

(58) Field of Classification Search
CPC ............ G02F 1/136286; G02F 1/1368; G09G 2300/0426; G09G 2300/0439; G09G 2300/0447; G09G 2300/0465; G09G 2300/08; G09G 2300/0852; G09G 2300/0876; G09G 3/3648; H01L 27/1222; H01L 27/124; H01L 27/125
See application file for complete search history.

(56) References Cited

U.S. PATENT DOCUMENTS

2012/0105785 A1   5/2012 Kim et al.
2014/0211142 A1   7/2014 Kim et al.
2014/0306219 A1*  10/2014 Yamazaki ........... H01L 27/1225
                                                                257/43

FOREIGN PATENT DOCUMENTS

KR   1020110117998   10/2011
KR   1020130033802   4/2013
KR   1020140049375   4/2014
KR   1020140097905   8/2014

* cited by examiner

Primary Examiner — Insa Sadio
(74) Attorney, Agent, or Firm — Cantor Colburn LLP

(57) ABSTRACT

A liquid crystal display according to an exemplary embodiment includes a first substrate, a gate line and a data line disposed on the first substrate, a first thin film transistor ("TFT") and a second TFT connected to the gate line and the data line, a first subpixel electrode connected to the first TFT, a first resistor connected to the second TFT, and a second subpixel electrode connected to the first resistor.

16 Claims, 18 Drawing Sheets

LIQUID CRYSTAL DISPLAY

This application claims priority to Korean Patent Application No. 10-2015-0024468 filed on Feb. 17, 2015, and all the benefits accruing therefrom under 35 U.S.C. § 119, the content of which in its entirety is herein incorporated by reference.

BACKGROUND

1. Field

Exemplary embodiments of the described technology relate generally to a liquid crystal display.

2. Description of the Related Art

A liquid crystal display ("LCD") is one of flat panel displays that are now widely used. The LCD generally includes two display panels in which field generating electrodes such as pixel electrodes and common electrodes are formed, and a liquid crystal layer interposed between the display panels. In the LCD, a voltage is applied to the field generating electrodes to generate an electric field in the liquid crystal layer, which determines the direction of liquid crystal molecules of the liquid crystal layer. An image is displayed by controlling the polarization of incident light through the liquid crystal layer.

Among the LCDs, a vertically aligned mode LCD, in which liquid crystal molecules are aligned so that long axes thereof are vertical to the upper and lower panels while an electric field is not applied, has been in the limelight because a contrast ratio is large and a wide reference viewing angle is easily implemented.

In order to approximate side visibility to front visibility in the vertical alignment mode LCD, a method to cause a difference in transmittance includes dividing one pixel into two subpixels and applying different voltages to the two subpixels has been suggested.

SUMMARY

When a side visibility is close to a front visibility by dividing one pixel into two subpixels and making transmittance different, an aperture ratio of a liquid crystal display ("LCD") may be reduced due to thin film transistors ("TFTs") and the contact holes. That is, since a plurality of transistors is formed to apply different voltages to the two subpixels and a plurality of contact holes are formed to connect the transistor and the subpixel, the aperture ratio of the LCD is reduced.

The described technology has been made in an effort to provide an LCD that may prevent an aperture ratio of an LCD from being reduced due to TFTs and contact holes as well as make side visibility close to front visibility by dividing one pixel into two subpixels and making transmittances thereof different.

An LCD according to an exemplary embodiment includes a first substrate, a gate line and a data line disposed on the first substrate, a first TFT and a second TFT connected to the gate line and the data line, a first subpixel electrode connected to the first TFT, a first resistor connected to the second TFT, and a second subpixel electrode connected to the first resistor.

In an exemplary embodiment, the first resistor may include a resistor input terminal connected to an output terminal of the second TFT, and a resistor output terminal connected to the second subpixel electrode.

In an exemplary embodiment, a resistor semiconductor layer disposed under the resistor input terminal and the output terminal may be further included.

In an exemplary embodiment, a part of the edge of the resistor input terminal and the resistor output terminal may overlap at least part of the edge of the resistor semiconductor layer.

In an exemplary embodiment, the LCD may further include a resistor reference voltage line disposed on the first substrate, and the first resistor may include a first resistor capacitor and a second resistor capacitor connected to the resistor reference voltage line.

In an exemplary embodiment, the resistor reference voltage line may be applied with a reference voltage of a predetermined magnitude, and the predetermined magnitude of the reference voltage may be larger than the magnitude of the data voltage applied to the data line.

In an exemplary embodiment, one terminal connected to the first resistor capacitor and the second resistor capacitor may be connected to the resistor reference voltage line, the other terminal of the first resistor capacitor may be connected to the resistor input terminal, and the other terminal of the second resistor capacitor may be connected to the resistor output terminal.

In an exemplary embodiment, the resistor reference voltage line may include a resistor reference electrode, and the resistor reference electrode may be disposed under the resistor semiconductor.

In an exemplary embodiment, the edge of the resistor reference electrode and the edge of the resistor semiconductor layer may be overlapped with each other, and the part of the edge of the resistor input terminal and the resistor output terminal may overlap at least part of the edge of the resistor reference electrode and the edge of the resistor semiconductor layer.

An LCD according to another exemplary embodiment includes a first substrate, a gate line and a data line disposed on the first substrate, a first TFT and a second TFT connected to the gate line and the data line, a first subpixel electrode connected to the first TFT, a second subpixel electrode connected to the second TFT, and a second resistor connected between the data line and the second TFT.

In an exemplary embodiment, the first resistor may include a resistor input terminal connected to the data line, and a resistor output terminal connected to the input terminal of the second TFT.

According to the LCD according to an exemplary embodiment, the aperture ratio decrease of the LCD due to the transistor and the contact hole may be prevented and side visibility may be made close to front visibility by dividing one pixel into two subpixels and making transmittances thereof different.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
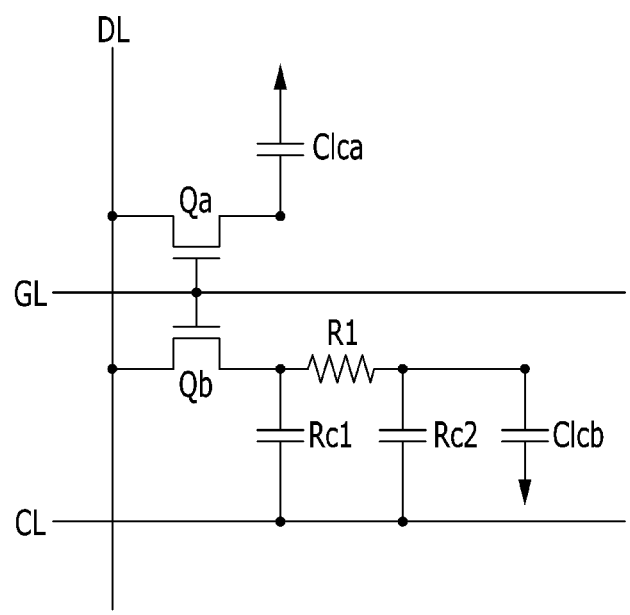
FIG. 1 is an equivalent circuit diagram of one pixel of a liquid crystal display ("LCD") according to an exemplary embodiment.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" or "beneath" can encompass both an orientation of above and below. The device may be otherwise oriented and the spatially relative descriptors used herein interpreted accordingly.

It will be understood that, although the terms first, second, third, etc., may be used herein to describe various elements, these elements should not be limited by these terms. These terms are only used to distinguish one element from another element. Thus, a first element discussed below could be termed a second element without departing from the teachings of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

First, an arrangement of a signal line and a pixel of a liquid crystal display ("LCD"), and a driving method thereof according to an exemplary embodiment will be described with reference to FIG. 1. FIG. 1 is an equivalent circuit diagram of one pixel of an LCD according to an exemplary embodiment.

Referring to FIG. 1, one pixel PX of an LCD according to the illustrated exemplary embodiment includes a plurality of signal lines including a gate line GL transmitting a gate signal, a data line DL transmitting a data signal, and a resistor reference voltage line CL transmitting a resistor reference voltage, a first switching element Qa and a second switching element Qb that are connected to the plurality of signal lines, and a first liquid crystal capacitor Clca and a second liquid crystal capacitor Clcb.

Each of the first switching element Qa and the second switching element Qb is connected to the gate line GL and the data line DL.

The first switching element Qa and the second switching element Qb are three-terminal elements such as a thin film transistor ("TFT"), a control terminal thereof is connected to the gate line GL, an input terminal thereof is connected to the data line DL, an output terminal of the first switching element Qa is connected to the first liquid crystal capacitor Clca, and an output terminal of the second switching element Qb is connected to the second liquid crystal capacitor Clcb.

A first resistor R1 is connected between the output terminal of the second switching element Qb and the second liquid crystal capacitor Clcb. The first resistor R1 is connected to the resistor reference voltage line CL, and includes a first resistor capacitor Rc1 and a second resistor capacitor Rc2. The resistor reference voltage line CL is applied with a reference voltage of a predetermined magnitude, and the magnitude of the reference voltage is larger than the magnitude of the data voltage applied to the data line DL.

When a gate-on signal is applied to the gate line GL, the first switching element Qa and the second switching element Qb connected thereto are turned on. Accordingly, the data voltage applied to the data line DL is applied to the first liquid crystal capacitor Clca and the second liquid crystal capacitor Clcb through the first switching element Qa and the second switching element Qb that are turned on. In this case, the data voltage applied to the second switching element Qb decreases while passing through the first resistor R1 before it is applied to the second liquid crystal capacitor Clcb.

Thus, the voltage charged in the second liquid crystal capacitor Clcb decreases by the resistance of the first resistor R1. Accordingly, a voltage charged to the first liquid crystal capacitor Clca is higher than a voltage charged to the second liquid crystal capacitor Clcb.

As such, the voltages charged to the first and second liquid crystal capacitors Clca and Clcb become different from each other. Since the voltages of the first and second liquid crystal capacitors Clca and Clcb become different from each other, the first and second subpixels including liquid crystal molecules having different tilt angles respectively have different luminances. Accordingly, when the voltages of the first and second liquid crystal capacitors Clca and Clcb are appropriately adjusted, an image viewed from the front is as close as possible to an image viewed from a side, thereby improving side visibility.

Next, a detailed configuration of the LCD according to the exemplary embodiment shown in FIG. 1 will be described with reference to FIGS. 2 to 5.

Figure 2:
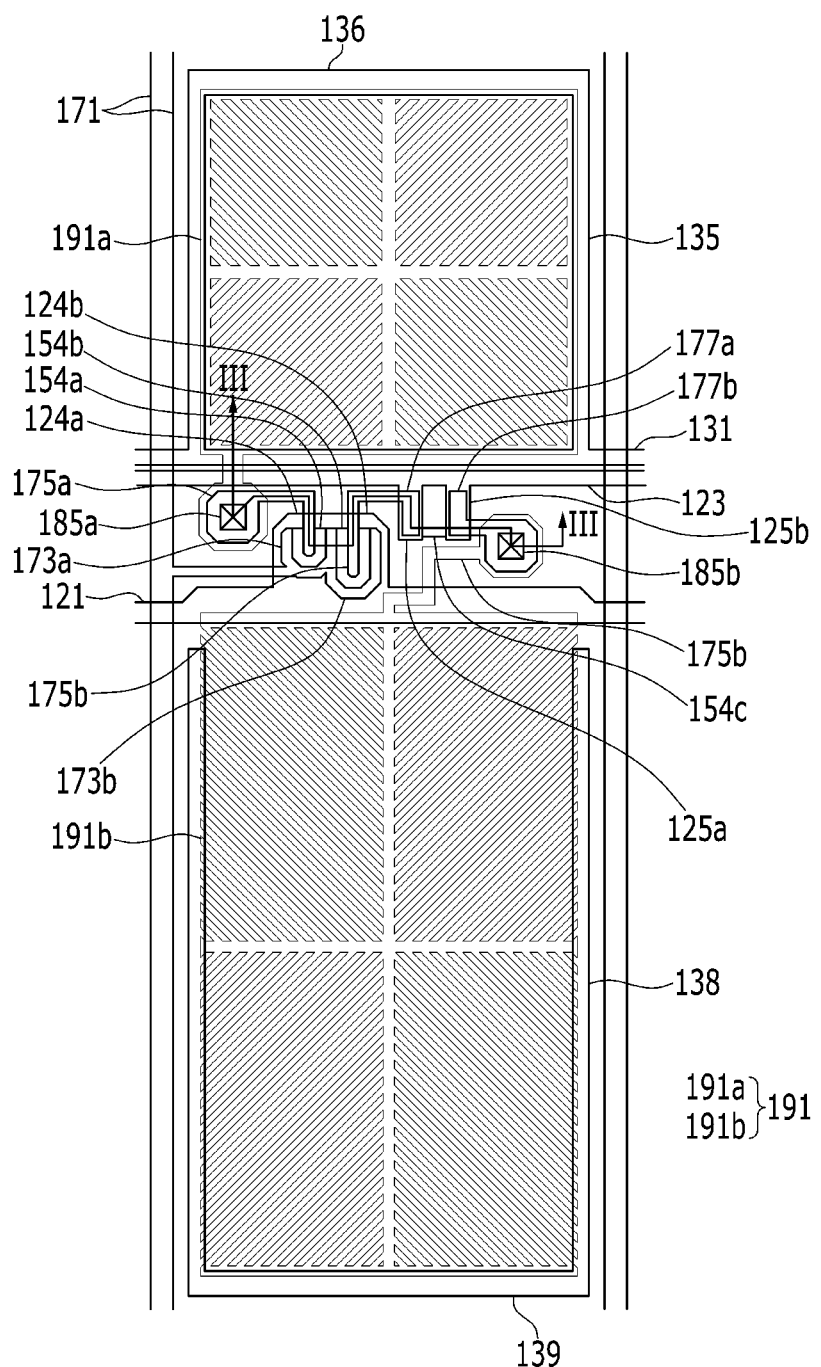
FIG. 2 is a plan view of an exemplary embodiment of an LCD according to the invention.
Figure 3:
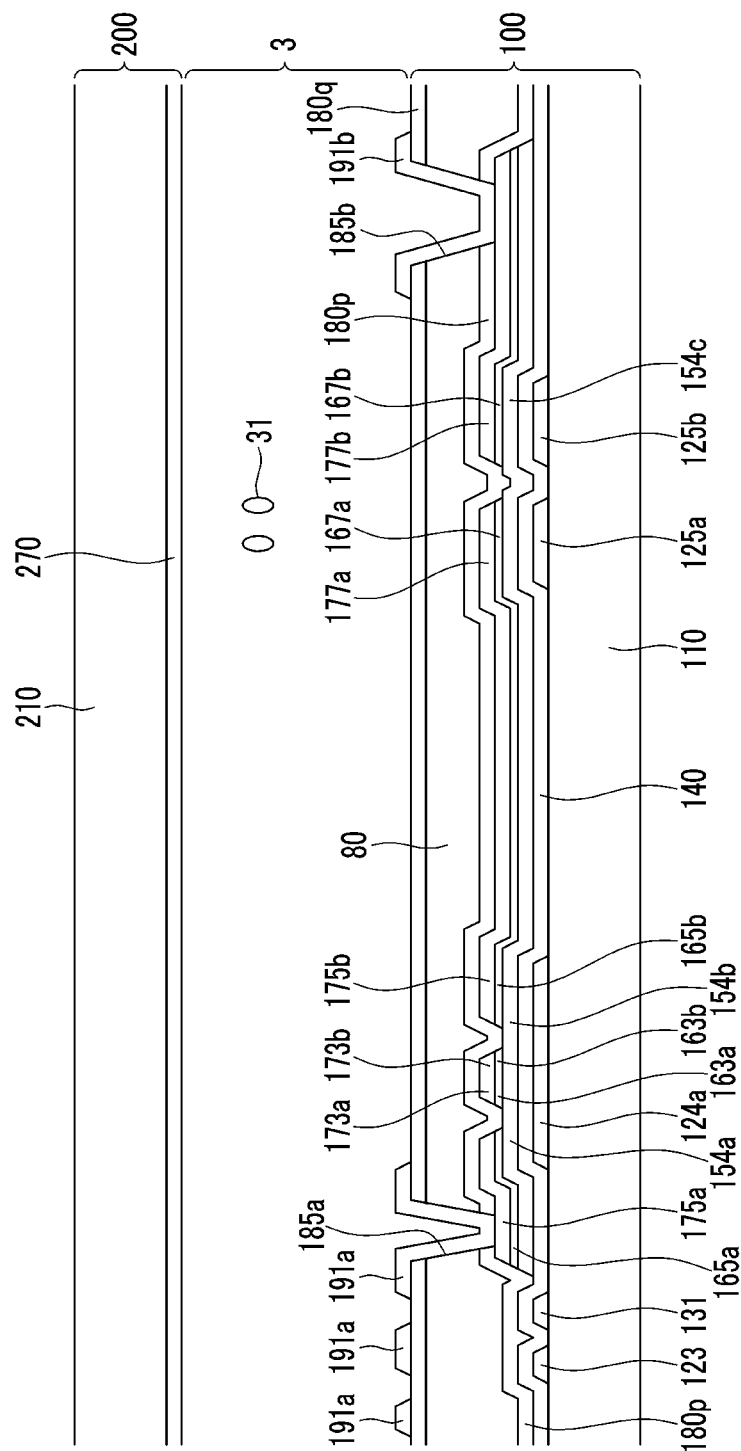
FIG. 3 is a cross-sectional view of the LCD of FIG. 2 taken along line III-III.
Figure 4A:
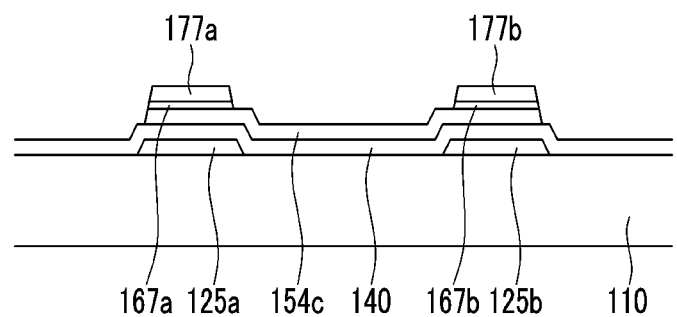
FIGS. 4A and 4B are drawings partially illustrating the LCD of FIG. 2.
Figure 4B:
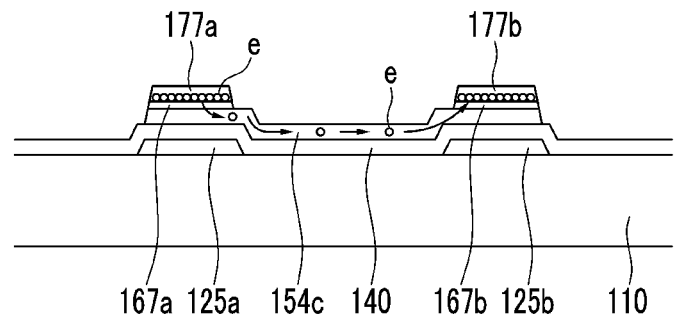
Figure 5:
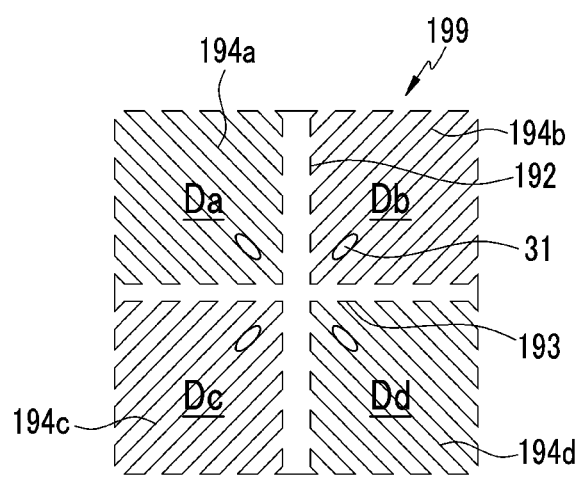
FIG. 5 is a top plan view of a basic area of a pixel electrode of the LCD of FIG. 2.

FIG. 2 is a plan view of an LCD according to an exemplary embodiment. FIG. 3 is a cross-sectional view of the LCD of FIG. 2 taken along line FIGS. 4A and 4B are views partially showing the LCD of FIG. 2. FIG. 5 is a top plan view of a basic area of a pixel electrode of the LCD of FIG. 2.

First, referring to FIGS. 2 and 3, the LCD device according to the illustrated exemplary embodiment includes a lower display panel 100 and an upper display panel 200 facing each other, a liquid crystal layer 3 interposed between the two display panels 100 and 200, and a pair of polarizers (not shown) attached to outer surfaces of the display panels 100 and 200.

First, the lower display panel 100 will be described.

In an exemplary embodiment, a gate conductor including a gate line 121, a resistor reference voltage line 123, and a storage voltage line 131 is disposed on a first substrate 110 including transparent glass or plastic, for example.

The gate line 121 includes a first gate electrode 124a and a second gate electrode 124b.

The resistor reference voltage line 123 includes a first resistor reference electrode 125a and a second resistor reference electrode 125b.

The storage voltage line 131 includes first storage electrodes 135 and 136. Second storage electrodes 138 and 139 that are not connected to the storage voltage line 131 but are overlapped with a second subpixel electrode 191b are disposed in the lower panel.

A gate insulating layer 140 is disposed on the gate line 121, the resistor reference voltage line 123, and the storage voltage line 131.

A first semiconductor 154a, a second semiconductor 154b, and a third semiconductor 154c are disposed on the gate insulating layer 140.

A plurality of ohmic contacts 163a, 165a, 163b, 165b, 167a, and 167b is disposed on the semiconductors 154a, 154b, and 154c.

A data conductor including a data line 171, a first source electrode 173a, a second source electrode 173b, a first drain electrode 175a, a second drain electrode 175b, a first resistor input electrode 177a, and a first resistor output electrode 177b is disposed on the ohmic contacts 163a, 165a, 163b, 165b, 167a, and 167b and the gate insulating layer 140.

The first source electrode 173a and the second source electrode 173b are extended from the data line 171.

The first resistor input electrode 177a is connected to the second source electrode 173b, and the first resistor output electrode 177b is connected to the second drain electrode 175b.

The data conductor, the semiconductor that is disposed below the data conductor, and the ohmic contacts may be simultaneously provided by using one mask.

The first gate electrode 124a, the first source electrode 173a, and the first drain electrode 175a provide a first TFT Qa along with the first semiconductor layer 154a, and a channel of the first TFT is defined at the first semiconductor layer 154a between the first source electrode 173a and the first drain electrode 175a. Similarly, the second gate electrode 124b, the second source electrode 173b, and the second drain electrode 175b provide a second TFT Qb along with the second semiconductor layer 154b, and a channel thereof is defined at the second semiconductor layer 154b between the second source electrode 173b and the second drain electrode 175b.

The resistor reference electrodes 125a and 125b are disposed under the first resistor input electrode 177a and the first resistor output electrode 177b, and the edge of the resistor reference electrodes 125a and 125b overlaps the edge of the first resistor input electrode 177a and the first resistor output electrode 177b.

A first passivation layer 180p is disposed on the data line 171, the first source electrode 173a, the second source electrode 173b, the first drain electrode 175a, the second drain electrode 175b, the first resistor input electrode 177a, the first resistor output electrode 177b, and the exposed portion of the semiconductors 154a, 154b, and 154c. In an exemplary embodiment, the first passivation layer 180p may include an inorganic insulating layer including a silicon nitride, a silicon oxide, or the like, for example. The first passivation layer 180p may prevent a pigment of a color filter 80 disposed thereon from flowing into the exposed semiconductor layers 154a, 154b, and 154c.

The color filter 80 is disposed on the first passivation layer 180p. The color filter 80 is extended in a vertical direction along two adjacent data lines. Although not illustrated, a light blocking member may be disposed on the first display panel 100.

A second passivation layer 180q is disposed on the color filter 80.

In an exemplary embodiment, the second passivation layer 180q may include an inorganic insulating layer including a silicon nitride, a silicon oxide, or the like, for example. The second passivation layer 180q prevents peeling of the color filter 80, and suppresses contamination of the liquid crystal layer 3 by an organic material such as a solvent flowing from the color filter 80 to prevent defects such as afterimages that may occur when a screen is driven.

A first contact hole 185a and a second contact hole 185b are defined in the first passivation layer 180p and the second passivation layer 180q to respectively expose the first drain electrode 175a and the second drain electrode 175b.

A plurality of pixel electrodes 191 is disposed on the second passivation layer 180q. Each pixel electrode 191 includes a first subpixel electrode 191a and a second subpixel electrode 191b that are separated from each other while interposing the gate line 121 therebetween and are adjacent in a column direction based on the gate line 121. In an exemplary embodiment, the pixel electrode 191 may include a transparent material such as indium tin oxide ("ITO") or indium zinc oxide ("IZO"). The pixel electrode 191 may also include a reflective metal such as aluminum, silver, chromium, or an alloy thereof.

Each of the first and second subpixel electrodes 191a and 191b includes one or more basic electrodes 199 illustrated in FIG. 5 or variations thereof.

The first and second subpixel electrodes 191a and 191b are physically and electrically connected to the first drain electrode 175a and the second drain electrode 175b through the first and second contact holes 185a and 185b, and are applied with the data voltage from the first drain electrodes 175a and the second drain electrode 175b, respectively.

As described above, the first resistor input electrode 177a and the first resistor output electrode 177b providing the first resistor R1 are disposed between the first source electrode 173b and the second drain electrode 175b, thereby decreasing the magnitude of the data voltage applied to the second drain electrode 175b. Thus, the voltage applied to the first subpixel electrode 191a is greater than that applied to the second subpixel electrode 191b.

The first subpixel electrode 191a and the second subpixel electrode 191b to which the data voltage is applied generate an electric field together with a common electrode 270 of the upper display panel 200 to determine an orientation of the liquid crystal molecules of the liquid crystal layer 3 between the two electrodes 191 and 270. Luminance of light passing through the liquid crystal layer 3 is changed according to such determined orientation of the liquid crystal molecules.

A first alignment layer (not shown) is disposed on the pixel electrode 191.

The upper panel 200 will now be described.

The common electrode 270 is disposed on a second substrate 210. A second alignment layer (not shown) is disposed on the common electrode 270.

In an exemplary embodiment, the liquid crystal layer 3 has negative dielectric anisotropy, for example, and liquid crystal molecules 31 of the liquid crystal layer 3 are aligned so that their long axes are perpendicular to the surfaces of the two display panels 100 and 200 while no electric field is present.

In an exemplary embodiment, a least one of the first alignment layer, the second alignment layer, and the liquid crystal layer may include photopolymers.

Next, the first resistor R1 of the LCD according to an exemplary embodiment will be described with reference to FIGS. 4A and 4B.

Referring to FIG. 4A, the first resistor reference electrode 125a and the second resistor reference electrode 125b are disposed on the first substrate 110, and the gate insulating layer 140 is disposed on the first resistor reference electrode 125a and the second resistor reference electrode 125b. The third semiconductor 154c is disposed on the gate insulating layer 140, and the ohmic contacts 167a and 167b are disposed on the third semiconductor 154c. The first resistor input electrode 177a and the first resistor output electrode 177b are disposed on the ohmic contacts 167a and 167b, respectively.

Referring to FIG. 4B, when the first resistor reference electrode 125a and the second resistor reference electrode 125b are applied with the resistor reference voltage, the charges are collected on the lower surface of the first resistor input electrode 177a and the first resistor output electrode 177b by the voltage applied to the first resistor reference electrode 125a. However, since the resistor reference electrode is not disposed between the first resistor input electrode 177a and the first resistor output electrode 177b, the charges collected on the lower surface of the first resistor input electrode 177a do not move into the first resistor output electrode 177b. As described above, the magnitude of the resistor reference voltage applied to the first resistor reference electrode 125a and the second resistor reference electrode 125b is larger than the magnitude of the data voltage applied to the data line 171. In this way, when the magnitude of the resistor reference voltage applied to the first resistor reference electrode 125a and the second resistor reference electrode 125b is substantially high, the amount of the accumulated charges on the first resistor input electrode 177a is increased and the accumulated charges are gradually moved through the third semiconductor 154c, and then are moved into the first resistor output electrode 177b such that the voltage is transmitted to the second drain electrode 175b. However, since no control electrode is disposed under the third semiconductor 154c between the first resistor input electrode 177a and the second resistor output electrode 177b, the third semiconductor 154c is not a channel and the third semiconductor 154c therebetween is a resistor, such that a portion of the voltage applied to the first resistor input electrode 177a is transmitted to the second resistor output electrode 177b. Accordingly, the magnitude of the voltage applied to the second drain electrode 175b is smaller than the magnitude of the data voltage applied to the first drain electrode 175a.

In this way, according to the LCD according to the illustrated exemplary embodiment, to decrease the magnitude of the voltage applied to the second subpixel electrode 191b without an additional TFT, by providing the resistor by using the gate conductor, the semiconductor, and the data conductor, the different voltages may be applied to the first subpixel electrode 191a and the second subpixel electrode 191b without further providing the TFT or the contact hole, the side visibility may be close to the front visibility, and a decrease of an aperture ratio of the LCD due to the TFT and the contact hole may be prevented.

The basic electrode 199 will now be described with reference to FIG. 5.

As shown in FIG. 5, the overall shape of the basic electrode 199 is quadrangular, and it includes a cross-shaped stem that includes a horizontal stem 193 and a vertical stem 192 that is perpendicular to the horizontal stem 193. Further, the basic electrode 199 is divided into a first subarea Da, a second subarea Db, a third subarea Dc, and a fourth subarea Dd by the horizontal stem 193 and the vertical stem 192, and each subarea Da, Db, Dc, and Dd includes a plurality of first to fourth minute branches 194a, 194b, 194c, and 194d, respectively.

The first minute branches 194a obliquely extend from the horizontal stem 193 or the vertical stem 192 in an upper left direction, and the second minute branches 194b obliquely extend from the horizontal stem 193 or the vertical stem 192 in an upper right direction. Further, the third minute branches 194c obliquely extend from the horizontal stem 193 or the vertical stem 192 in a lower left direction, and the fourth minute branches 194d obliquely extend from the horizontal stem 193 or vertical stem 192 in a lower right direction.

The first to fourth minute branches 194a, 194b, 194c, and 194d define an angle of about 45 degrees)(°)or about 135° with the gate line 121 or the horizontal stem 193. Further, the minute branches 194a, 194b, 194c, and 194d of two neighboring subareas Da, Db, Dc, and Dd may be perpendicular to each other.

As described above, the first subpixel electrode 191a and the second subpixel electrode 191b are respectively connected to the first drain electrode 175a and the second drain electrode 175b through the first contact hole 185a and the second contact hole 185b, and receive a voltage from the first drain electrode 175a and the second drain electrode 175b. In this case, sides of the first to fourth minute branches 194a, 194b, 194c, and 194d distort an electric field to generate a horizontal component determining an inclination direction of the liquid crystal molecules 31. The horizontal component of the electric field is nearly horizontal to the sides of the first to fourth fine branches 194a, 194b, 194c, and 194d. Therefore, as shown in FIG. 5, the liquid crystal molecules 31 are inclined in a direction that is parallel to length directions of the minute branches 194a, 194b, 194c, and 194d. Since one basic electrode 199 includes the four subareas Da to Dd in which length directions of the minute branches 194a, 194b, 194c, and 194d are different from each other, there are about four directions in which the liquid crystal molecules 31 are inclined, and four domains where the alignment directions of the liquid crystal molecules 31 are different from each other are defined in the liquid crystal layer 3. As described above, when the inclination directions of the liquid crystal molecules are diversified, a reference viewing angle of the LCD is increased.

Next, a method of initially aligning the liquid crystal molecules 31 to have the pretilt will be described with reference to FIG. 6.

Figure 6:
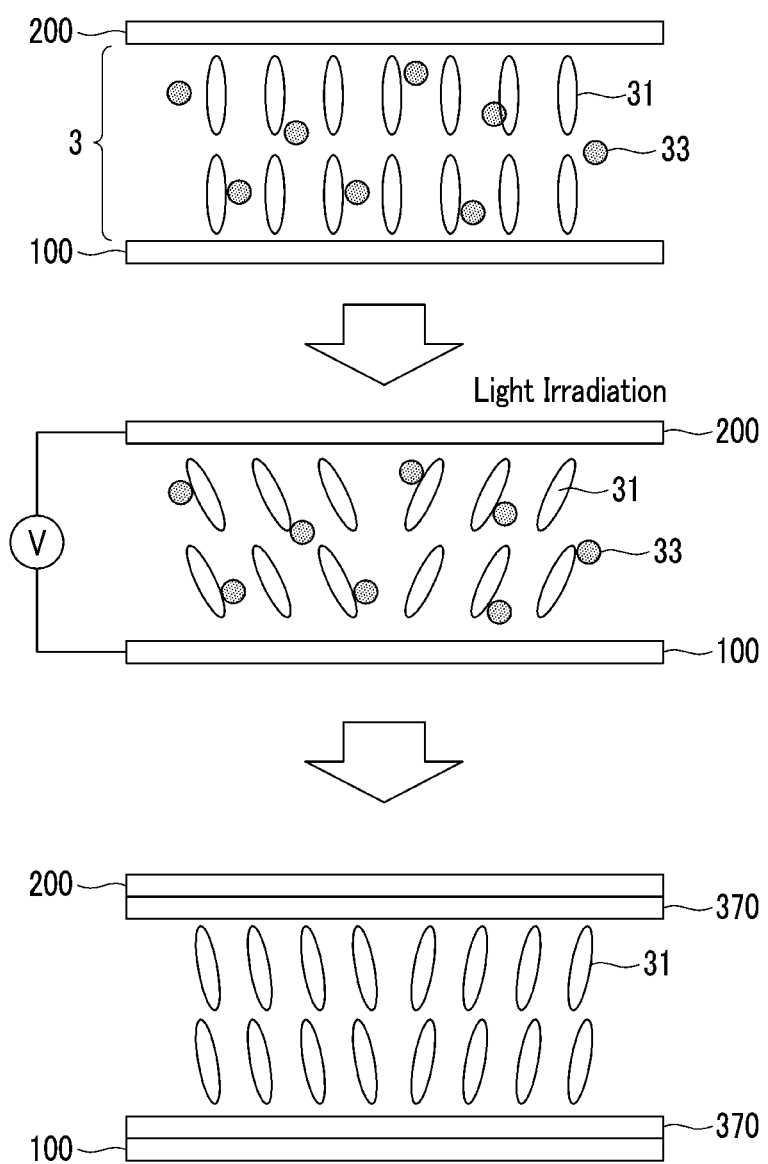
FIG. 6 illustrates a process for providing a pretilt to liquid crystal molecules by using prepolymers that are polymerized by light such as ultraviolet rays.

FIG. 6 illustrates a process for providing a pretilt to liquid crystal molecules by using prepolymers that are polymerized by light such as ultraviolet ("UV") rays.

First, a prepolymer 33 such as a monomer that is polymerized by light such as UV rays is injected along with a liquid crystal material between the two display panels 100 and 200. In an exemplary embodiment, the prepolymer 33 may be a reactive mesogen that is polymerized by light such as UV rays.

Next, an electric field is generated in the liquid crystal layer 3 between the display panels 100 and 200 by applying a data voltage to the first subpixel electrode 191a and the second subpixel electrode 191b and applying a common voltage to the common electrode 270 of the upper panel 200. Thus, the liquid crystal molecules 31 of the liquid crystal layer 3 are inclined in the direction parallel to the length directions of the minute branches 194a, 194b, 194c, and 194d through the two steps as described above in response to the electric field, and thus the liquid crystal molecules 31 in one pixel PX are inclined in a total of four directions.

When light such as UV rays is irradiated after an electric field is generated in the liquid crystal layer 3, the prepolymer 33 is polymerized to provide a polymer 370, as shown in FIG. 6. The polymer 370 is provided to contact the display panels 100 and 200. The alignment directions of the liquid crystal molecules 31 are determined to have a pretilt corresponding to the aforementioned direction by the polymer 370. Accordingly, the liquid crystal molecules 31 are arranged to have pretilts corresponding to four different directions even in a state in which a voltage is not applied to the field generating electrodes 191 and 270.

Figure 7:
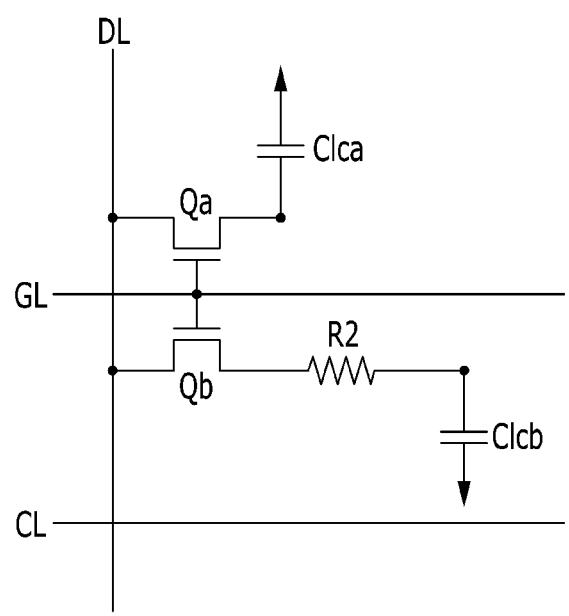
FIG. 7 is an equivalent circuit diagram of another exemplary embodiment of one pixel of an LCD according to the invention.
Figure 8:
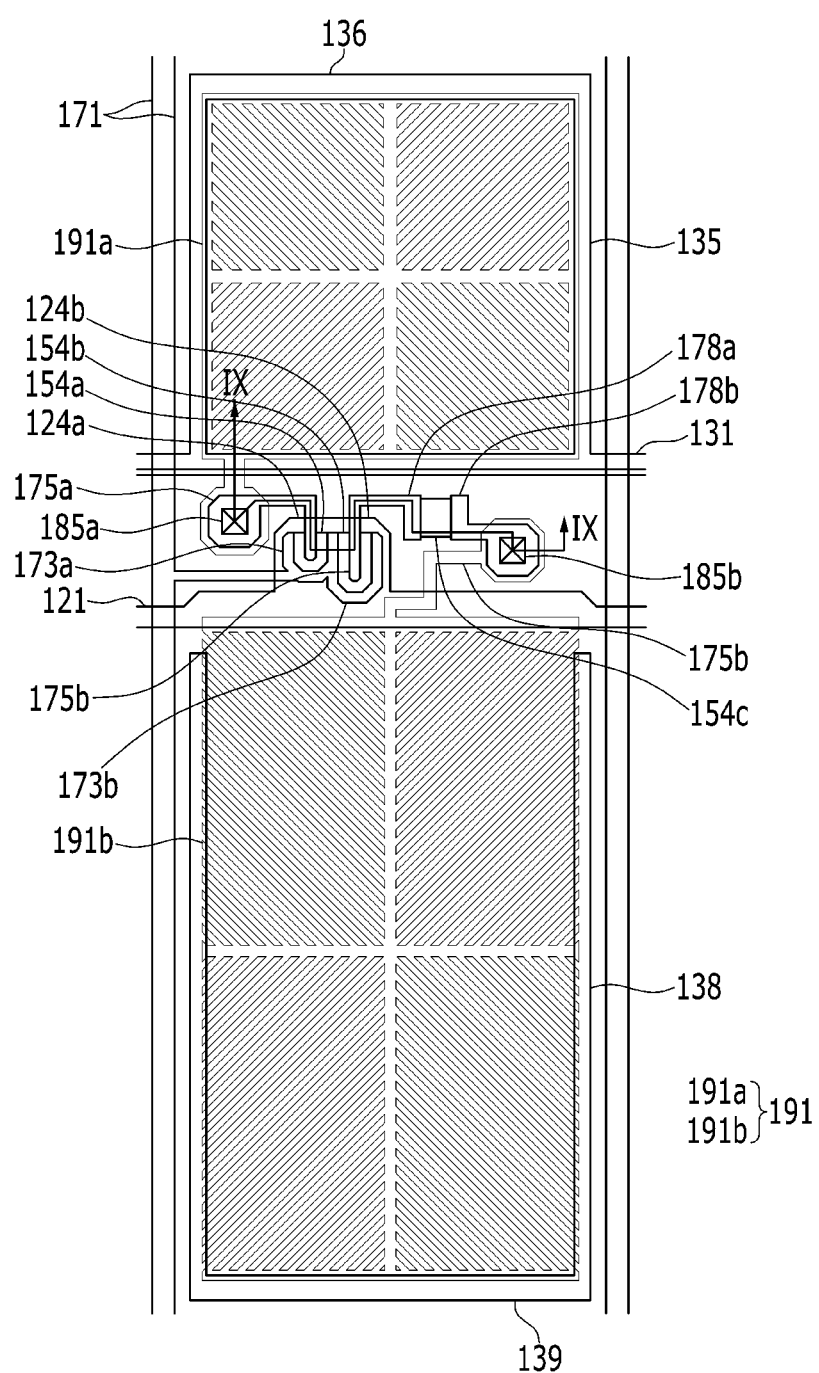
FIG. 8 is a plan view of another exemplary embodiment of an LCD according to the invention.
Figure 9:
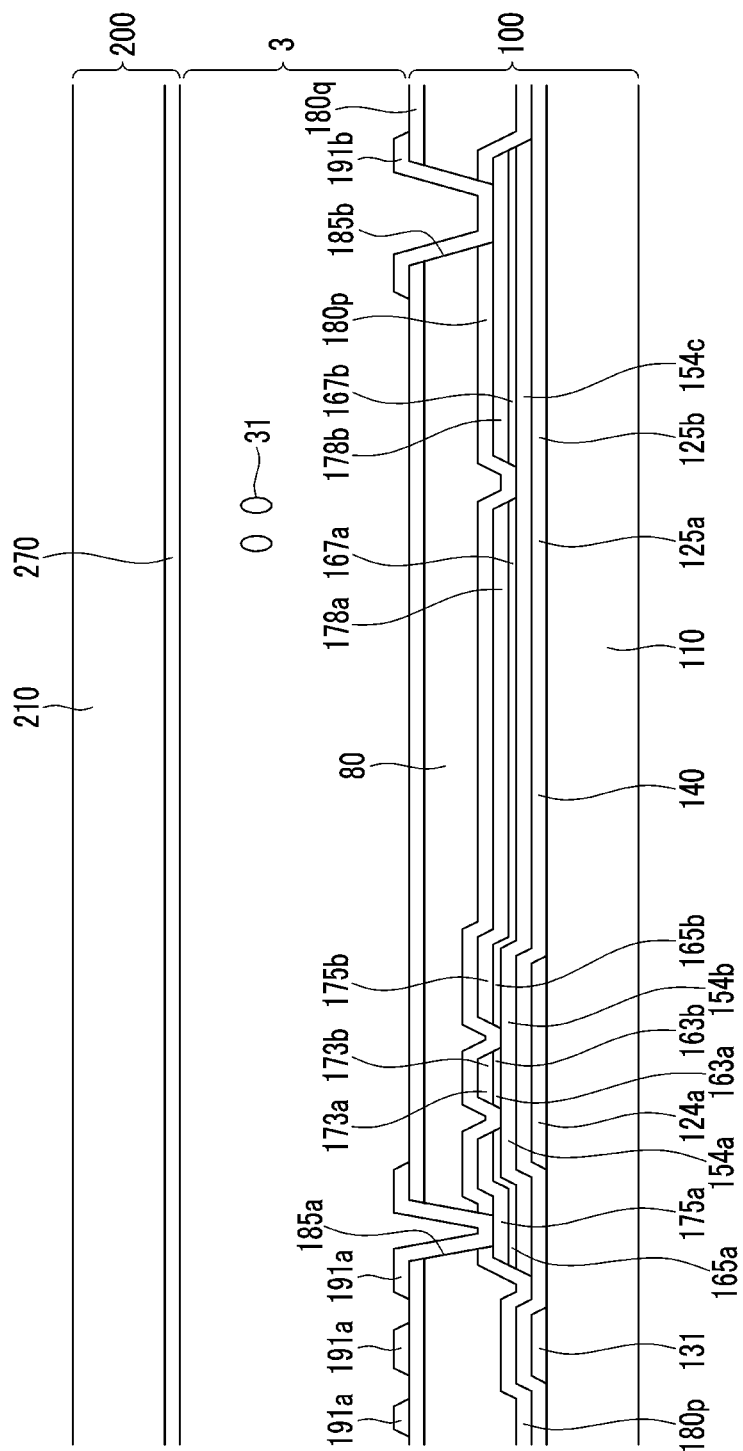
FIG. 9 is a cross-sectional view of the LCD of FIG. 8 taken along line IX-IX.
Figure 10:
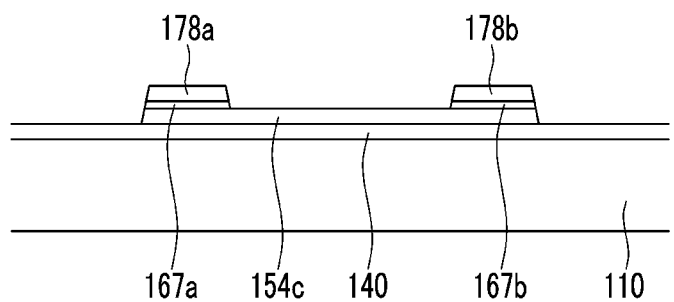
FIG. 10 is a view partially illustrating the LCD of FIG. 8.

Next, the LCD according to an exemplary embodiment will be described with reference to FIGS. 7 to 10. FIG. 7 is an equivalent circuit diagram of one pixel of an LCD according to another exemplary embodiment. FIG. 8 is a plan view of an LCD according to another exemplary embodiment. FIG. 9 is a cross-sectional view of the LCD of FIG. 8 taken along line IX-IX. FIG. 10 is a view partially illustrating the LCD of FIG. 8.

First, the arrangement of the signal line and the pixel of the LCD and the driving method thereof according another exemplary embodiment will be described with reference to FIG. 7.

Referring to FIG. 7, one pixel PX of an LCD according to the illustrated exemplary embodiment includes a plurality of signal lines including a gate line GL transmitting a gate signal and a data line DL transmitting a data signal, a first switching element Qa and a second switching element Qb that are connected to the plurality of signal lines, and a first liquid crystal capacitor Clca and a second liquid crystal capacitor Clcb.

The first switching element Qa and the second switching element Qb are respectively connected to the gate line GL and the data line DL.

The first switching element Qa and the second switching element Qb are three-terminal elements such as a TFT, a control terminal thereof is connected to the gate line GL, an input terminal thereof is connected to the data line DL, an output terminal of the first switching element Qa is connected to the first liquid crystal capacitor Clca, and the output terminal of the second switching element Qb is connected to the second liquid crystal capacitor Clcb.

A second resistor R2 is connected between the output terminal of the second switching element Qb and the second liquid crystal capacitor Clcb.

When a gate-on signal is applied to the gate line GL, the first switching element Qa and the second switching element Qb connected thereto are turned on. Accordingly, the data voltage applied to the data line DL is applied to the first liquid crystal capacitor Clca and the second liquid crystal capacitor Clcb through the first switching element Qa and the second switching element Qb that are turned on. In this case, the data voltage applied to the second switching element Qb decreases while passing through the second resistor R2 before it is applied to the second liquid crystal capacitor Clcb.

Thus, the voltage charged in the second liquid crystal capacitor Clcb decreases by the resistance of the second resistor R2. Accordingly, the voltage charged to the first liquid crystal capacitor Clca is higher than the voltage charged to the second liquid crystal capacitor Clcb.

As such, the voltages charged to the first and second liquid crystal capacitors Clca and Clcb become different from each other. Since the voltages of the first and second liquid crystal capacitors Clca and Clcb become different from each other, the first and second subpixels including liquid crystal molecules having different tilt angles respectively have different luminances. Accordingly, when the voltages of the first and second liquid crystal capacitors Clca and Clcb are appropriately adjusted, an image viewed from the front is as close as possible to an image viewed from a side, thereby improving side visibility.

Next, a detailed configuration of the LCD according to the exemplary embodiment shown in FIG. 7 will be described with reference to FIGS. 8 to 10.

Referring to FIGS. 8 and 9, the LCD according to the illustrated exemplary embodiment is similar to the LCD according to the exemplary embodiment described with reference to FIGS. 2 and 3. The detailed description of the same constituent elements is omitted.

Referring to FIGS. 8 and 9, the LCD according to the illustrated exemplary embodiment includes lower and upper panels 100 and 200 facing each other, a liquid crystal layer 3 interposed between the two display panels 100 and 200, and a pair of polarizers (not shown) attached to outer surfaces of the display panels 100 and 200.

The lower panel 100 will be described first.

A gate conductor including a gate line 121 and a storage voltage line 131 is disposed on a first insulation substrate 110 that includes transparent glass, plastic, or the like.

The gate line 121 includes a first gate electrode 124a and a second gate electrode 124b. The storage voltage line 131 includes first storage electrodes 135 and 136, and second storage electrodes 138 and 139 that are not connected to the storage voltage line 131 but are overlapped with a second subpixel electrode 191b are disposed in the lower panel.

The gate insulating layer 140 is disposed on the gate line 121 and the storage voltage line 131.

The first semiconductor 154a, the second semiconductor 154b, and the third semiconductor 154c are disposed on the gate insulating layer 140.

A plurality of ohmic contacts 163a, 165a, 163b, 165b, 167a, and 167b is disposed on the semiconductors 154a, 154b, and 154c.

The data conductor including a data line 171, first and second source electrodes 173a and 173b, first and second drain electrodes 175a and 175b, a second resistor input electrode 178a, and a second resistor output electrode 178b is disposed on the ohmic contacts 163a, 165a, 163b, 165b, 167a, and 167b and the gate insulating layer 140.

The first source electrode 173a and the second source electrode 173b are extended from the data line 171 to be connected to the data line 171.

The second resistor input electrode 178a is connected to the second source electrode 173b and the second resistor output electrode 178b is connected to the second drain electrode 175b.

A first passivation layer 180p is disposed on the data line 171, the first source electrode 173a, the second source electrode 173b, the first drain electrode 175a, the second drain electrode 175b, the second resistor input electrode 178a, the second resistor output electrode 178b, and the exposed portion of the semiconductors 154a, 154b, and 154c.

The color filter 80 is disposed on the first passivation layer 180p.

The second passivation layer 180q is disposed on the color filter 80.

The first contact hole 185a and the second contact hole 185b exposing the first drain electrode 175a and the second drain electrode 175b are defined in the first passivation layer 180p and the second passivation layer 180q.

A plurality of pixel electrodes 191 is disposed on the second passivation layer 180q. Each pixel electrode 191 includes the first subpixel electrode 191a and the second subpixel electrode 191b.

The first and second subpixel electrodes 191a and 191b respectively include one or more basic electrodes 199 illustrated in FIG. 5 or variations thereof.

The first and second subpixel electrodes 191a and 191b are physically and electrically connected to the first drain electrode 175a and the second drain electrode 175b through the first and second contact holes 185a and 185b, and are applied with the data voltage from the first drain electrodes 175a and the second drain electrode 175b, respectively.

As described above, the second resistor input electrode 178a and the second resistor output electrode 178b providing the second resistor R2 are disposed between the first source electrode 173b and the second drain electrode 175b, thereby decreasing the magnitude of the data voltage applied to the second drain electrode 175b. Thus, the voltage applied to the first subpixel electrode 191a is greater than that applied to the second subpixel electrode 191b.

The first subpixel electrode 191a and the second subpixel electrode 191b to which the data voltage is applied generate the electric field together with the common electrode 270 of the upper panel 200 to determine an orientation of the liquid crystal molecules of the liquid crystal layer 3 between the two electrodes 191 and 270. Luminance of light passing through the liquid crystal layer 3 is changed according to such determined orientation of the liquid crystal molecules.

The first alignment layer (not shown) is disposed on the pixel electrode 191.

The upper panel 200 will now be described.

The common electrode 270 is disposed on the second substrate 210. The second alignment layer (not shown) is disposed on the common electrode 270.

In an exemplary embodiment, the liquid crystal layer 3 has negative dielectric anisotropy, for example, and liquid crystal molecules 31 of the liquid crystal layer 3 are aligned so that their long axes are perpendicular to the surfaces of the two display panels 100 and 200 while no electric field is present.

A least one of the first alignment layer, the second alignment layer, and the liquid crystal layer may include photopolymers.

Next, the second resistor R2 of the LCD according to an exemplary embodiment will be described with reference to FIG. 10.

Referring to FIG. 10, the gate insulating layer 140 is disposed on the first substrate 110. The third semiconductor 154c is disposed on the gate insulating layer 140, and the ohmic contacts 167a and 167b are disposed on the third semiconductor 154c. The second resistor input electrode 178a and the second resistor output electrode 178b are disposed on the ohmic contacts 167a and 167b, respectively.

The value of the second resistor R2 is proportional to the resistivity and the area of the third semiconductor 154c.

If the data voltage is applied to the second resistor input electrode 178a through the second source electrode 173b, the charges accumulated to the second resistor input electrode 178a are transmitted to the second resistor output electrode 178b through the charges vibrated in the third semiconductor 154c. In this case, the voltage applied to the second resistor input electrode 178a is partially transmitted to the second resistor output electrode 178b by the resistivity of the third semiconductor 154c. Accordingly, the magnitude of the voltage applied to the second drain electrode 175b is smaller than the magnitude of the data voltage applied to the first drain electrode 175a.

In this way, according to the LCD according to the illustrated exemplary embodiment, to decrease the magnitude of the voltage applied to the second subpixel electrode 191b without an additional TFT, by providing the resistor by using the gate conductor, the semiconductor, and the data conductor, the different voltages may be applied to the first subpixel electrode 191a and the second subpixel electrode 191b without further providing the TFT or the contact hole, the side visibility may be close to the front visibility, and a decrease of an aperture ratio of the LCD due to the TFT and the contact hole may be prevented.

Figure 11:
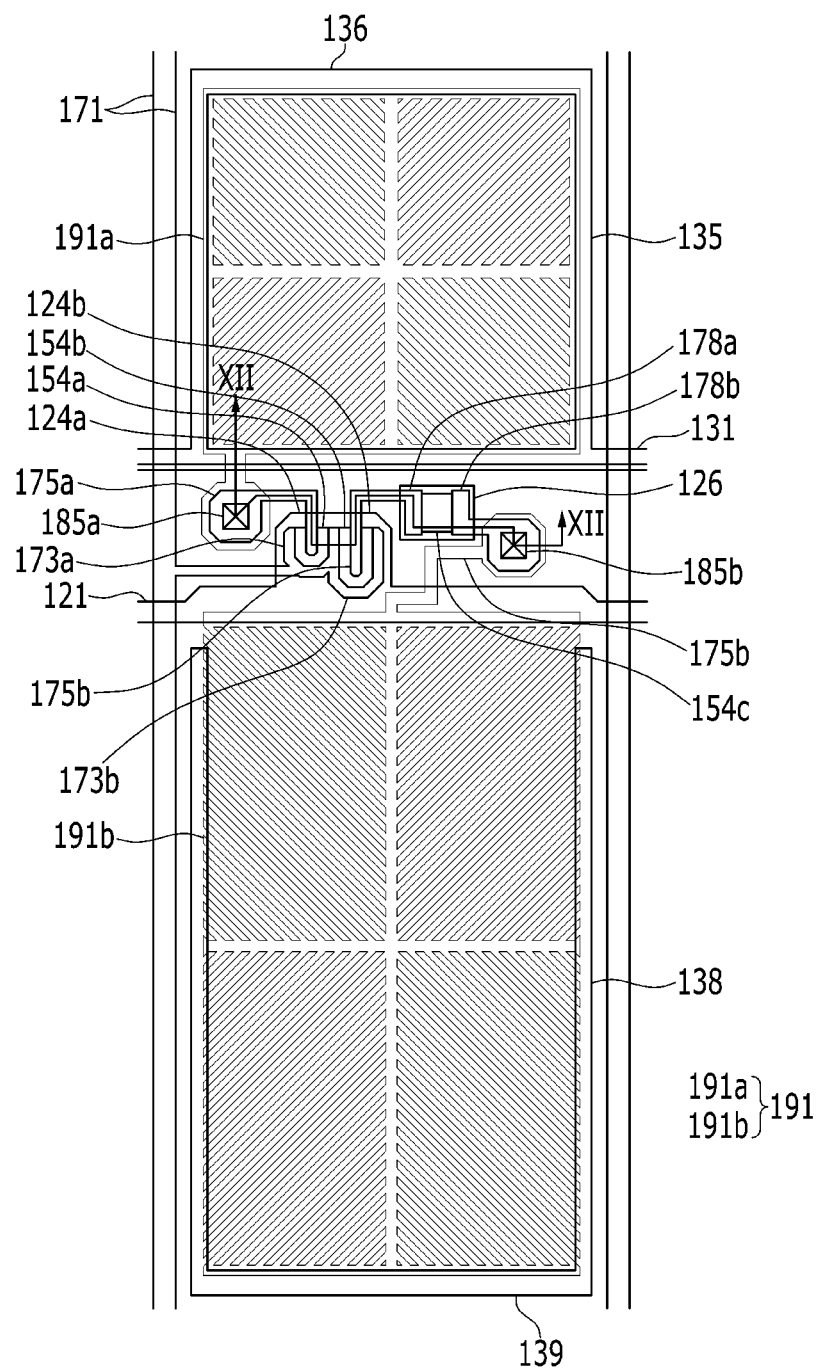
FIG. 11 is a plan view of another exemplary embodiment of an LCD according to the invention.
Figure 12:
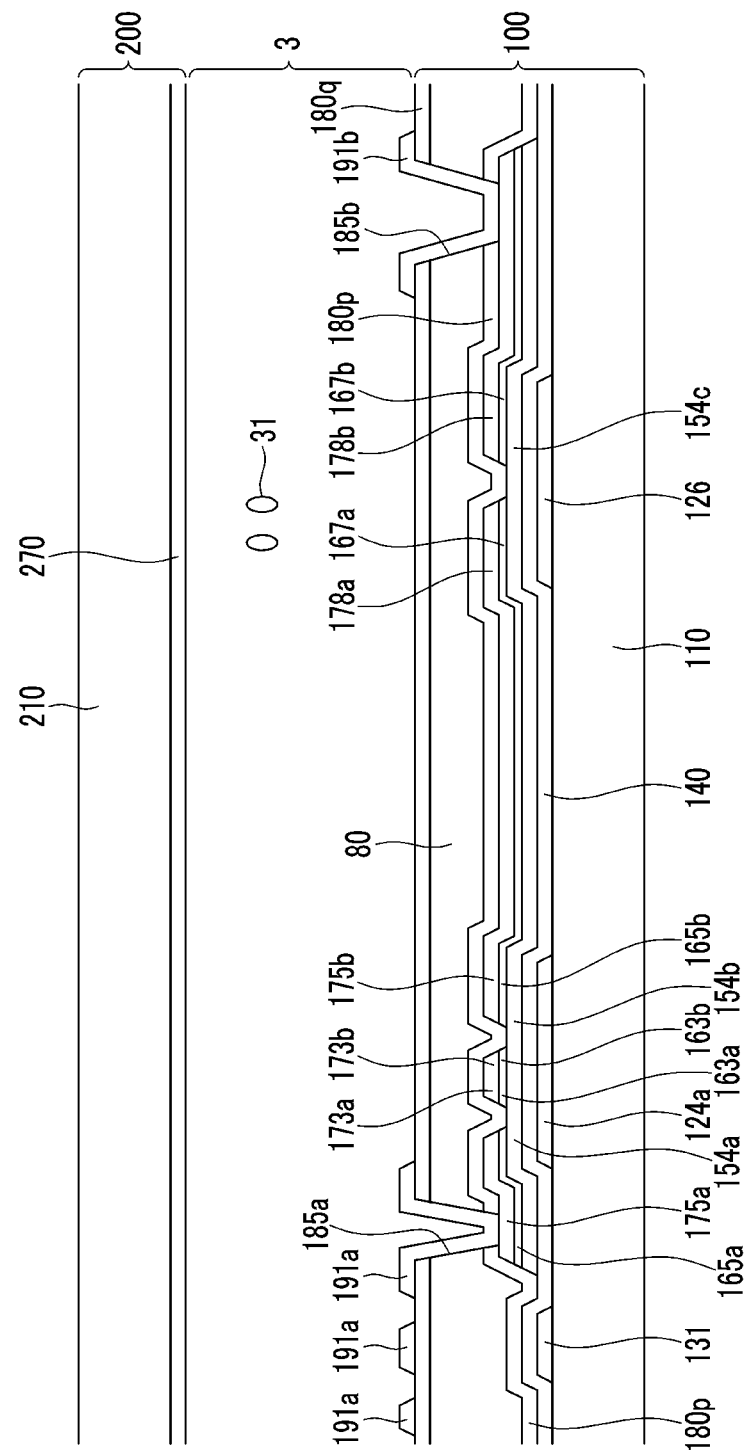
FIG. 12 is a cross-sectional view of the LCD of FIG. 11 taken along line XII-XII.

Next, the LCD according to another exemplary embodiment of, the invention will be described with reference to FIGS. 11 and 12. FIG. 11 is a plan view of an LCD according to another exemplary embodiment. FIG. 12 is a cross-sectional view of the LCD of FIG. 11 taken along line XII-XII.

Referring to FIGS. 11 and 12, the LCD according to the illustrated exemplary embodiment is similar to the LCD according to the exemplary embodiment described with reference to FIGS. 8 and 9. The detailed description of the same constituent elements is omitted.

Referring to FIGS. 11 and 12, the LCD according to the illustrated exemplary embodiment includes lower and upper panels 100 and 200 facing each other, a liquid crystal layer 3 interposed between the two display panels 100 and 200, and a pair of polarizers (not shown) attached to outer surfaces of the display panels 100 and 200.

The lower panel 100 will be described first.

In an exemplary embodiment, a gate conductor including a gate line 121 and a storage voltage line 131 is disposed on a first insulation substrate 110 that includes transparent glass, plastic, or the like, for example. In the LCD according to the illustrated exemplary embodiment, differently from the LCD according to the exemplary embodiment shown in FIGS. 8 and 9, a light blocking layer 126 is disposed under the third semiconductor 154c. The light blocking layer 126 includes the gate conductor.

The gate line 121 includes the first gate electrode 124a and the second gate electrode 124b. The storage voltage line 131 includes first storage electrodes 135 and 136, and second storage electrodes 138 and 139 that are not connected to the storage voltage line 131 but are overlapped with a second subpixel electrode 191b are disposed in the lower panel.

The gate insulating layer 140 is disposed on the gate line 121, the storage voltage line 131, and the light blocking layer 126.

The first semiconductor 154a, the second semiconductor 154b, and the third semiconductor 154c are disposed on the gate insulating layer 140.

A plurality of ohmic contacts 163a, 165a, 163b, 165b, 167a, and 167b is disposed on the semiconductors 154a, 154b, and 154c.

The data conductor including the data line 171, the first source electrode 173a, the second source electrode 173b, the first drain electrode 175a, the second drain electrode 175b, the second resistor input electrode 178a, and the second resistor output electrode 178b is disposed on the ohmic contacts 163a, 165a, 163b, 165b, 167a, and 167b and the gate insulating layer 140.

The first source electrode 173a and the second source electrode 173b are extended from the data line 171 to be connected to the data line 171. The second resistor input electrode 178a is connected to the second source electrode 173b, and the second resistor output electrode 178b is connected to the second drain electrode 175b.

The first passivation layer 180p is disposed on the data line 171, the first source electrode 173a, the second source electrode 173b, the first drain electrode 175a, the second drain electrode 175b, the second resistor input electrode 178a, the second resistor output electrode 178b, and the exposed portion of the semiconductors 154a, 154b, and 154c.

The color filter 80 is disposed on the first passivation layer 180p.

The second passivation layer 180q is disposed on the color filter 80.

The first contact hole 185a and the second contact hole 185b exposing the first drain electrode 175a and the second drain electrode 175b are defined in the first passivation layer 180p and the second passivation layer 180q.

A plurality of pixel electrodes 191 is disposed on the second passivation layer 180q. Each pixel electrode 191 includes the first subpixel electrode 191a and the second subpixel electrode 191b.

The first and second subpixel electrodes 191a and 191b respectively include one or more basic electrodes 199 illustrated in FIG. 5 or variations thereof.

The first and second subpixel electrodes 191a and 191b are physically and electrically connected to the first drain electrode 175a and the second drain electrode 175b through the first and second contact holes 185a and 185b, and are applied with the data voltage from the first drain electrodes 175a and the second drain electrode 175b, respectively.

As described above, the second resistor input electrode 178a and the second resistor output electrode 178b providing the second resistor R2 are disposed between the first source electrode 173b and the second drain electrode 175b, thereby decreasing the magnitude of the data voltage applied to the second drain electrode 175b. Thus, the voltage applied to the first subpixel electrode 191a is greater than that applied to the second subpixel electrode 191b.

The first subpixel electrode 191a and the second subpixel electrode 191b to which the data voltage is applied generate an electric field together with a common electrode 270 of the upper panel 200 to determine an orientation of the liquid crystal molecules of the liquid crystal layer 3 between the two electrodes 191 and 270. Luminance of light passing through the liquid crystal layer 3 is changed according to such determined orientation of the liquid crystal molecules.

The first alignment layer (not shown) is disposed on the pixel electrode 191.

The upper panel 200 will now be described.

The common electrode 270 is disposed on the second substrate 210. The second alignment layer (not shown) is disposed on the common electrode 270.

In an exemplary embodiment, the liquid crystal layer 3 has negative dielectric anisotropy, for example, and liquid crystal molecules 31 of the liquid crystal layer 3 are aligned so that their long axes are perpendicular to the surfaces of the two display panels 100 and 200 while no electric field is present.

A least one of the first alignment layer, the second alignment layer, and the liquid crystal layer may include photopolymers.

As described above, in the LCD according to the illustrated exemplary embodiment, differently from the LCD according to the exemplary embodiment shown in FIG. 8 and FIG. 9, the light blocking layer 126 including the gate conductor is disposed under the third semiconductor 154c. The light blocking layer 126 prevents the light incident from the backlight from being incident to the third semiconductor 154c. Accordingly, a photo leakage current due to the backlight may be prevented.

Also, as the LCD according to the illustrated exemplary embodiment includes the second resistor R2 including the third semiconductor 154c, the second resistor input electrode 178a, and the second resistor output electrode 178b, to decrease the magnitude of the voltage applied to the second subpixel electrode 191b without an additional TFT, by providing the resistor by using the gate conductor, the semiconductor, and the data conductor, the different voltages may be applied to the first subpixel electrode 191a and the second subpixel electrode 191b without further providing the TFT or the contact hole, the side visibility may be close to the front visibility, and a decrease of an aperture ratio of the LCD due to the TFT and the contact hole may be prevented.

Next, the LCD according to another exemplary embodiment of, the invention will be described with reference to FIGS. 13 to 15.

First, the arrangement of the signal line and the pixel of the LCD and the driving method thereof according another exemplary embodiment will be described with reference to FIG. 13. FIG. 13 is an equivalent circuit diagram of one pixel of an LCD according to another exemplary embodiment.

Figure 13:
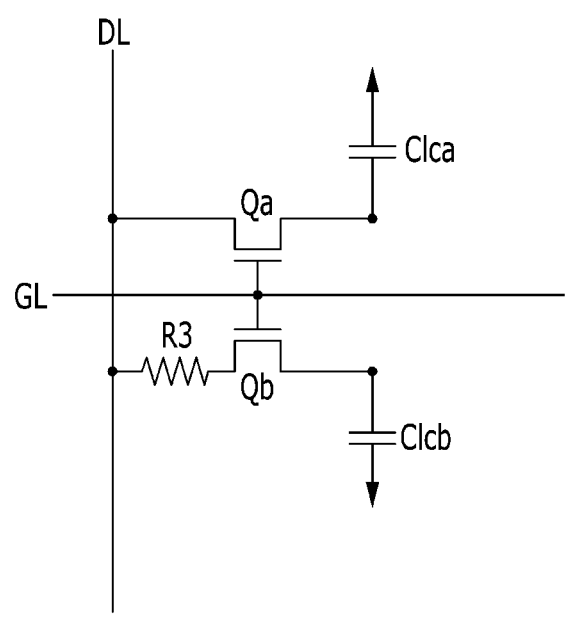
FIG. 13 is an equivalent circuit diagram of one pixel of an LCD according to another exemplary embodiment.

Referring to FIG. 13, one pixel PX of an LCD according to the illustrated exemplary embodiment includes a plurality of signal lines including a gate line GL transmitting a gate signal and a data line DL transmitting a data signal, a first switching element Qa and a second switching element Qb that are connected to the plurality of signal lines, and a first liquid crystal capacitor Clca and a second liquid crystal capacitor Clcb.

The first switching element Qa and the second switching element Qb are respectively connected to the gate line GL and the data line DL.

The first switching element Qa and the second switching element Qb are three-terminal elements such as a TFT, a control terminal thereof is connected to the gate line GL, an input terminal thereof is connected to the data line DL, an output terminal of the first switching element Qa is connected to the first liquid crystal capacitor Clca, and the output terminal of the second switching element Qb is connected to the second liquid crystal capacitor Clcb.

A third resistor R3 is connected between the data line DL and the input terminal of the second switching element Qb.

When a gate-on signal is applied to the gate line GL, the first switching element Qa and the second switching element Qb connected thereto are turned on. Accordingly, the data voltage applied to the data line DL is applied to the first liquid crystal capacitor Clca and the second liquid crystal capacitor Clcb through the first switching element Qa and the second switching element Qb that are turned on. In this case, the data voltage applied to the second switching element Qb decreases while passing through the third resistor R3 before it is applied to the second liquid crystal capacitor Clcb.

Thus, the voltage charged in the second liquid crystal capacitor Clcb decreases by the resistance of the third resistor R3. Accordingly, the voltage charged to the first liquid crystal capacitor Clca is higher than the voltage charged to the second liquid crystal capacitor Clcb.

As such, the voltages charged to the first and second liquid crystal capacitors Clca and Clcb become different from each other. Since the voltages of the first and second liquid crystal capacitors Clca and Clcb become different from each other, the first and second subpixels including liquid crystal molecules having different tilt angles respectively have different luminances. Accordingly, when the voltages of the first and second liquid crystal capacitors Clca and Clcb are appropriately adjusted, an image viewed from the front is as close as possible to an image viewed from a side, thereby improving side visibility.

Next, a detailed configuration of the LCD according to the exemplary embodiment shown in FIG. 13 will be described with reference to FIGS. 14 and 15. FIG. 14 is a plan view of an LCD according to another exemplary embodiment. FIG. 15 is a cross-sectional view of the LCD of FIG. 14 taken along a line XV-XV.

Figure 14:
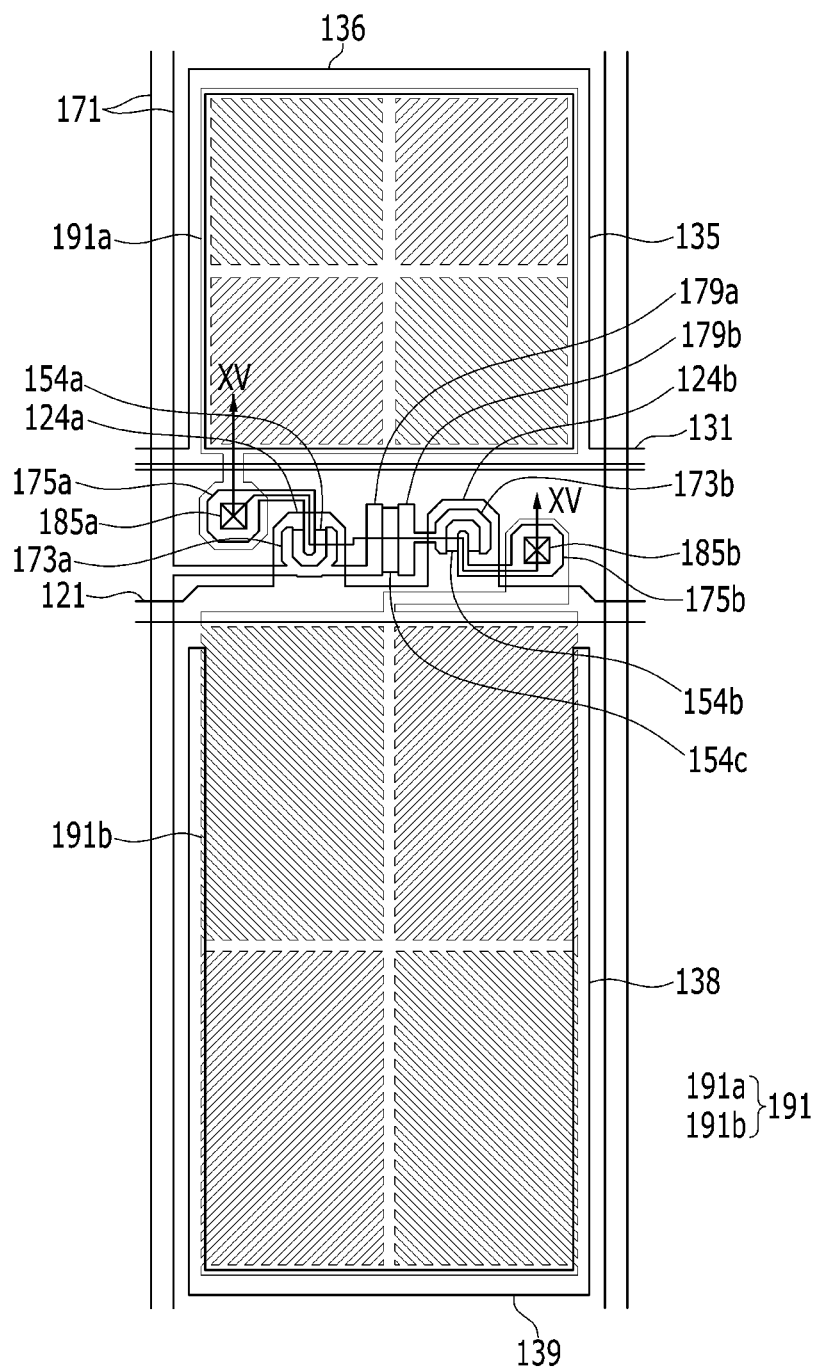
FIG. 14 is a plan view of another exemplary embodiment of an LCD according to the invention.
Figure 15:
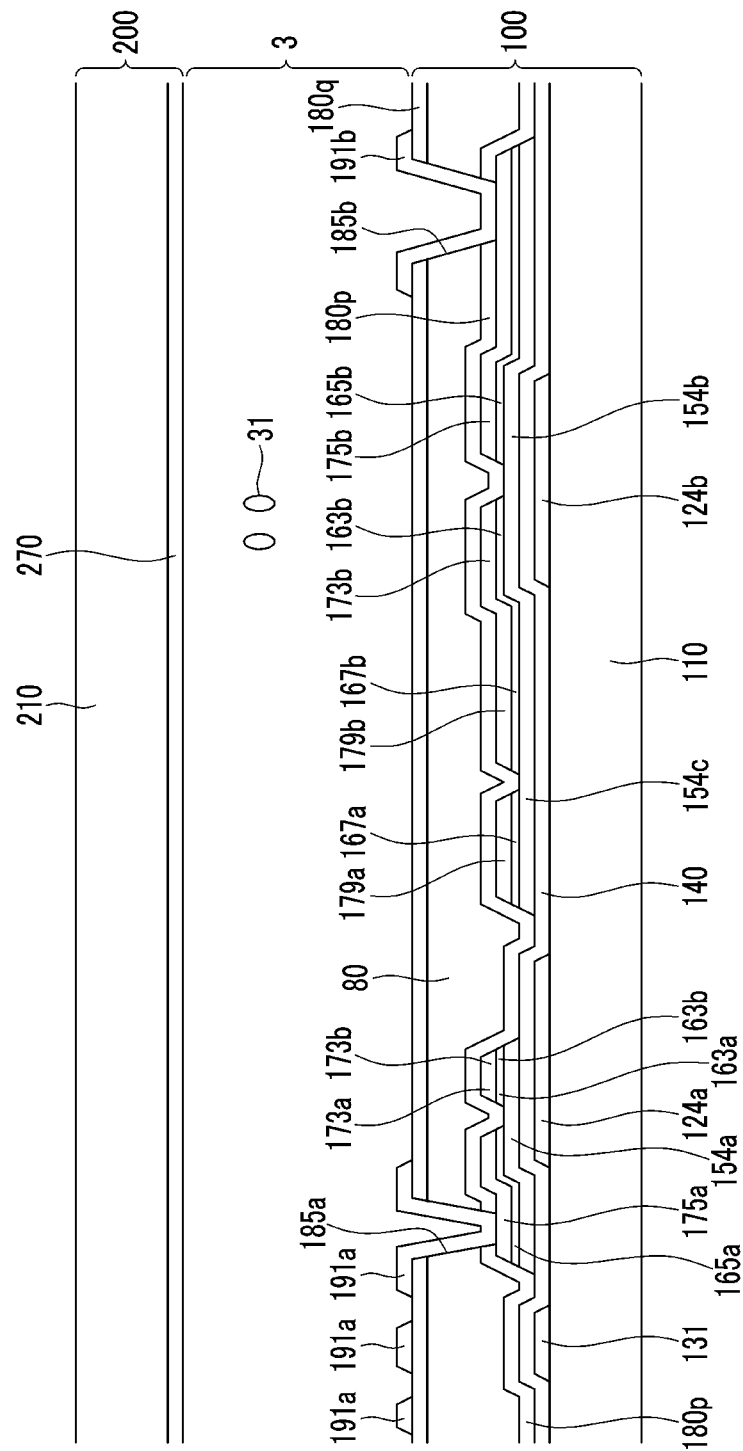
FIG. 15 is a cross-sectional view of the LCD of FIG. 14 taken along line XV-XV.

Referring to FIGS. 14 and 15, the LCD according to the illustrated exemplary embodiment is similar to the LCD according to the exemplary embodiment described with reference to FIGS. 2 and 3. The detailed description of the same constituent elements is omitted.

Referring to FIGS. 14 and 15, the LCD according to the illustrated exemplary embodiment includes lower and upper panels 100 and 200 facing each other, a liquid crystal layer 3 interposed between the two display panels 100 and 200, and a pair of polarizers (not shown) attached to outer surfaces of the display panels 100 and 200.

The lower panel 100 will be described first.

A gate conductor including a gate line 121 and a storage voltage line 131 is disposed on a first insulation substrate 110 that includes transparent glass, plastic, or the like.

The gate line 121 includes a first gate electrode 124a and a second gate electrode 124b. The storage voltage line 131 includes first storage electrodes 135 and 136, and second storage electrodes 138 and 139 that are not connected to the storage voltage line 131 but are overlapped with a second subpixel electrode 191b are disposed in the lower panel.

The gate insulating layer 140 is disposed on the gate line 121 and the storage voltage line 131.

The first semiconductor 154a, the second semiconductor 154b, and the third semiconductor 154c are disposed on the gate insulating layer 140.

A plurality of ohmic contacts 163a, 165a, 163b, 165b, 167a, and 167b is disposed on the semiconductors 154a, 154b, and 154c.

The data conductor including a data line 171, first and second source electrodes 173a and 173b, first and second drain electrodes 175a and 175b, a third resistor input electrode 179a, and a third resistor output electrode 179b is disposed on the ohmic contacts 163a, 165a, 163b, 165b, 167a, and 167b and the gate insulating layer 140.

The first source electrode 173a and the second source electrode 173b are extended from the data line 171 to be connected to the data line 171.

The third resistor input electrode 179a is connected to the data line 171, and the third resistor output electrode 179b is connected to the second source electrode 173b.

A first passivation layer 180p is disposed on the data line 171, the first source electrode 173a, the second source electrode 173b, the first drain electrode 175a, the second drain electrode 175b, the third resistor input electrode 179a, the third resistor output electrode 179b, and the exposed portion of the semiconductors 154a, 154b, and 154c.

The color filter 80 is disposed on the first passivation layer 180p.

The second passivation layer 180q is disposed on the color filter 80.

The first contact hole 185a and the second contact hole 185b exposing the first drain electrode 175a and the second drain electrode 175b are defined in the first passivation layer 180p and the second passivation layer 180q.

A plurality of pixel electrodes 191 is disposed on the second passivation layer 180q. Each pixel electrode 191 includes the first subpixel electrode 191a and the second subpixel electrode 191b.

The first and second subpixel electrodes 191a and 191b respectively include one or more basic electrodes 199 illustrated in FIG. 5 or variations thereof.

The first and second subpixel electrodes 191a and 191b are physically and electrically connected to the first drain electrode 175a and the second drain electrode 175b through the first and second contact holes 185a and 185b, and are applied with the data voltage from the first drain electrodes 175a and the second drain electrode 175b, respectively.

As described above, the third second resistor input electrode 179a and the third resistor output electrode 179b providing the third resistor R3 are disposed between the data line 171 and the second source electrode 173b, thereby decreasing the magnitude of the data voltage applied to the data line 171. Thus, the voltage applied to the first subpixel electrode 191a is greater than that applied to the second subpixel electrode 191b.

The first subpixel electrode 191a and the second subpixel electrode 191b to which the data voltage is applied generate the electric field together with the common electrode 270 of the upper panel 200 to determine an orientation of the liquid crystal molecules of the liquid crystal layer 3 between the two electrodes 191 and 270. Luminance of light passing through the liquid crystal layer 3 is changed according to such determined orientation of the liquid crystal molecules.

The first alignment layer (not shown) is disposed on the pixel electrode 191.

The upper panel 200 will now be described.

The common electrode 270 is disposed on the second substrate 210. The second alignment layer (not shown) is disposed on the common electrode 270. In an exemplary embodiment, the liquid crystal layer 3 has negative dielectric anisotropy, for example, and liquid crystal molecules 31 of the liquid crystal layer 3 are aligned so that their long axes are perpendicular to the surfaces of the two display panels 100 and 200 while no electric field is present.

A least one of the first alignment layer, the second alignment layer, and the liquid crystal layer may include photopolymers.

Figure 16:
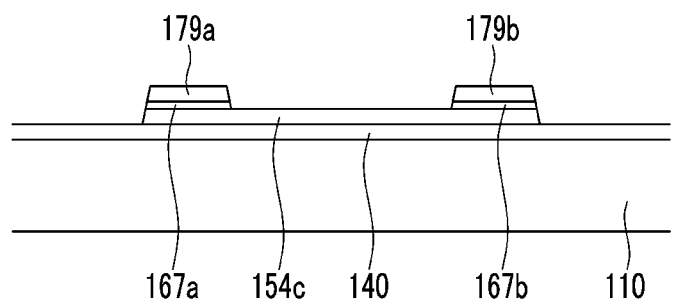
FIG. 16 is a view partially illustrating the LCD of FIG. 14.

Next, the third resistor R3 of the LCD according to an exemplary embodiment will be described with reference to FIG. 16. FIG. 16 is a view partially showing the LCD of FIG. 14.

Referring to FIG. 16, the layered structure of the third resistor R3 of the LCD according to the illustrated exemplary embodiment is similar to the second resistor R2 of the LCD according to the exemplary embodiment shown in FIG. 10.

As shown in FIG. 16, the gate insulating layer 140 is disposed on the first substrate 110. The third semiconductor 154c is disposed on the gate insulating layer 140, and the ohmic contacts 167a and 167b are disposed on the third semiconductor 154c. The third resistor input electrode 179a and the third resistor output electrode 179b are disposed on the ohmic contacts 167a and 167b, respectively.

The resistance of the third resistor R3 is proportional to the resistivity and the area of the third semiconductor 154c.

If the data voltage is applied through the data line 171, the charges accumulated to the third resistor input electrode 179a are transmitted to the third resistor output electrode 179b by the charges vibrated in the third semiconductor 154c. In this case, by the resistivity of the third semiconductor 154c, the voltage applied to the third resistor input electrode 179a is partially transmitted to the third resistor output electrode 179b. Accordingly, the magnitude of the voltage applied to the second drain electrode 175b is smaller than the magnitude of the data voltage applied to the first drain electrode 175a.

In this way, according to the LCD according to the illustrated exemplary embodiment, to decrease the magnitude of the voltage applied to the second subpixel electrode 191b without an additional TFT, by providing the resistor by using the gate conductor, the semiconductor, and the data conductor, the different voltages may be applied to the first subpixel electrode 191a and the second subpixel electrode 191b without further providing the TFT or the contact hole, the side visibility may be close to the front visibility, and a decrease of an aperture ratio of the LCD due to the TFT and the contact hole may be prevented.

Many characteristics of the LCDs according the above-described several exemplary embodiments may be applied to the LCD according to the illustrated exemplary embodiment.

Figure 17:
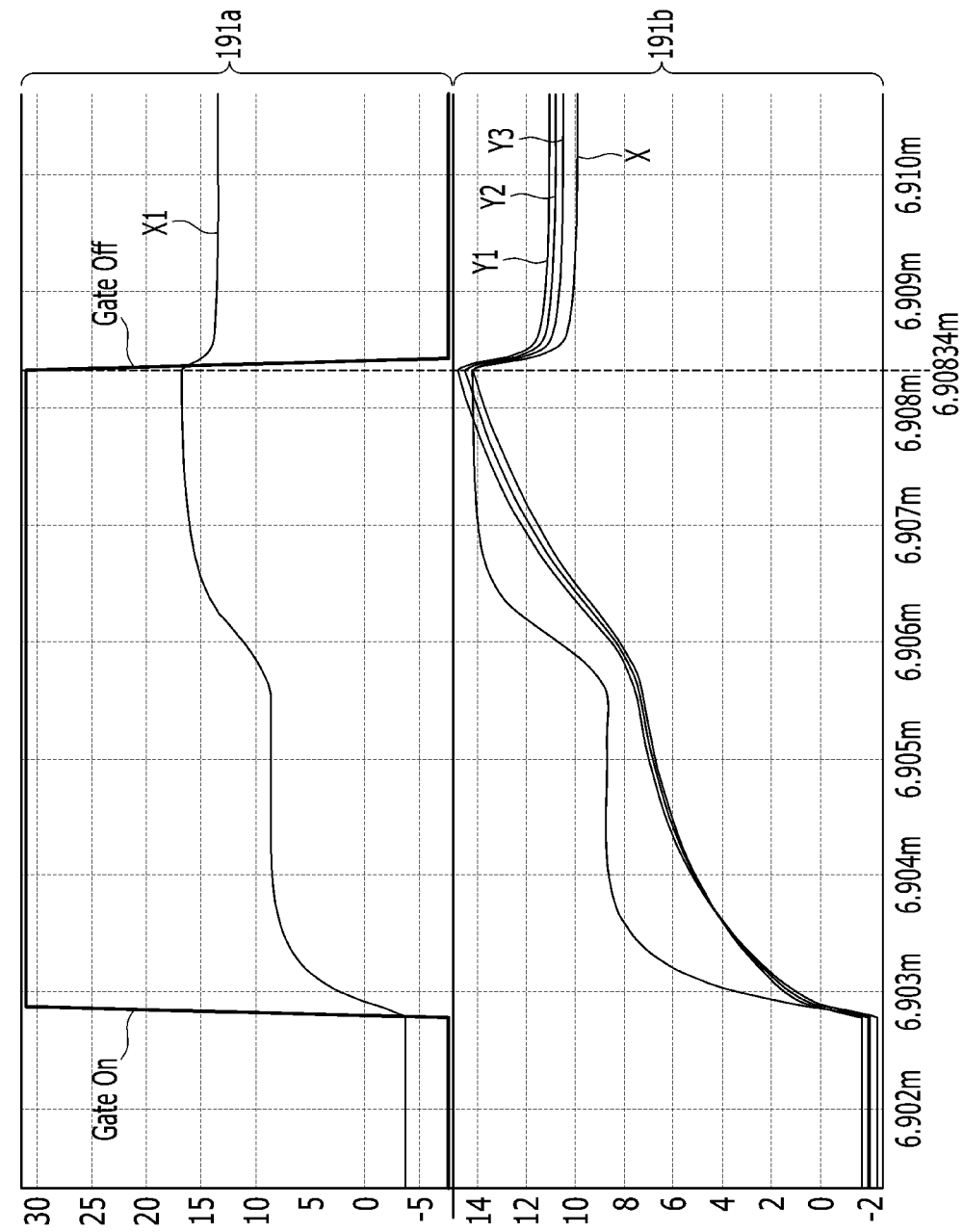
FIG. 17 is a graph illustrating results of an experimental example of an exemplary embodiment according to the invention.

Next, an experimental example according to an exemplary embodiment will be described with reference to FIG. 17. FIG. 17 is a graph illustrating results of an experimental example according to an exemplary embodiment.

In the experimental example, like the conventional LCD, for a first case X differentiating the magnitudes of the voltages applied to the first subpixel electrode 191a and the second subpixel electrode 191b by providing the gate line connected to the first switching element Qa and the second switching element Qb and the third switching element connected to the second drain electrode 175b, and like the LCD according to an exemplary embodiment, a second case Y1 providing the first resistor R1 between the second source electrode 173b and the second drain electrode 175b, a third case Y2 providing the second resistor R2 between the second source electrode 173b and the second drain electrode 175b, and a fourth case Y3 providing the third resistor R3 between the data line 171 and the second source electrode 173b, the voltages applied to the first subpixel electrode 191a and the second subpixel electrode 191b are measured and a result thereof is shown in FIG. 17.

Referring to FIG. 17, the voltage applied to the first subpixel electrode 191a is all the same for the first case, the second case, the third case, and the fourth case.

Also, the magnitude of the voltage applied to the second subpixel electrode 191b is smaller than the magnitude of the voltage applied to the first subpixel electrode 191a, compared with the first case like the conventional LCD, and in the second case to the fourth case like the LCD according to an exemplary embodiment, it may also be confirmed that the magnitude of the voltage of the second subpixel electrode 191b may be controlled.

Next, another experimental example of the invention will be described with reference to Table 1.

In the experimental example, like the conventional LCD, for a first case X differentiating the magnitudes of the voltages applied to the first subpixel electrode 191a and the second subpixel electrode 191b by providing the gate line connected to the first switching element Qa and the second switching element Qb and the third switching element connected to the second drain electrode 175b, the magnitude of the first voltage applied to the first subpixel electrode 191a and the magnitude of the second voltage applied to the second subpixel electrode 191b are measured. Also, like the LCD according to an exemplary embodiment, for the second case providing the first resistor R1 or the second resistor R2 between the second source electrode 173b and the second drain electrode 175b and the third case providing the third resistor R3 between the data line 171 and the second source electrode 173b, the magnitude of the first voltage applied to the first subpixel electrode 191a and the magnitude of the second voltage applied to the second subpixel electrode 191b are measured while differentiating the magnitude of each resistor. A result thereof is shown in Table 1.

TABLE 1

|  | Resistor magnitude (kΩ) | First voltage (V) | Second voltage (V) |
|---|---|---|---|
| First case |  | 16.9 | 14.18 |
| Second case | 2500 | 16.9 | 15.05 |
|  | 3000 | 16.9 | 14.67 |
|  | 3500 | 16.9 | 14.30 |
|  | 4000 | 16.9 | 13.95 |
|  | 4500 | 16.9 | 13.62 |
| Third case | 2500 | 16.9 | 15.81 |
|  | 3000 | 16.9 | 15.17 |
|  | 3500 | 16.9 | 14.45 |
|  | 4000 | 16.9 | 14.12 |
|  | 4500 | 16.9 | 13.79 |

Referring to Table 1, compared with the first case like the conventional LCD, in the second case and the third case like the LCD according to an exemplary embodiment, by controlling the magnitude of the resistor, the voltage magnitude of the second subpixel electrode 191b may be controlled to be smaller than the voltage magnitude of the first subpixel electrode 191a.

In this way, according to the illustrated exemplary embodiment of the LCD, to decrease the magnitude of the voltage applied to the second subpixel electrode 191b without an additional TFT, by providing the resistor by using the gate conductor, the semiconductor, and the data conductor, the different voltages may be applied to the first subpixel electrode 191a and the second subpixel electrode 191b without further providing the TFT or the contact hole, the side visibility may be close to the front visibility, and a decrease of an aperture ratio of the LCD due to the TFT and the contact hole may be prevented.

Figure 18:
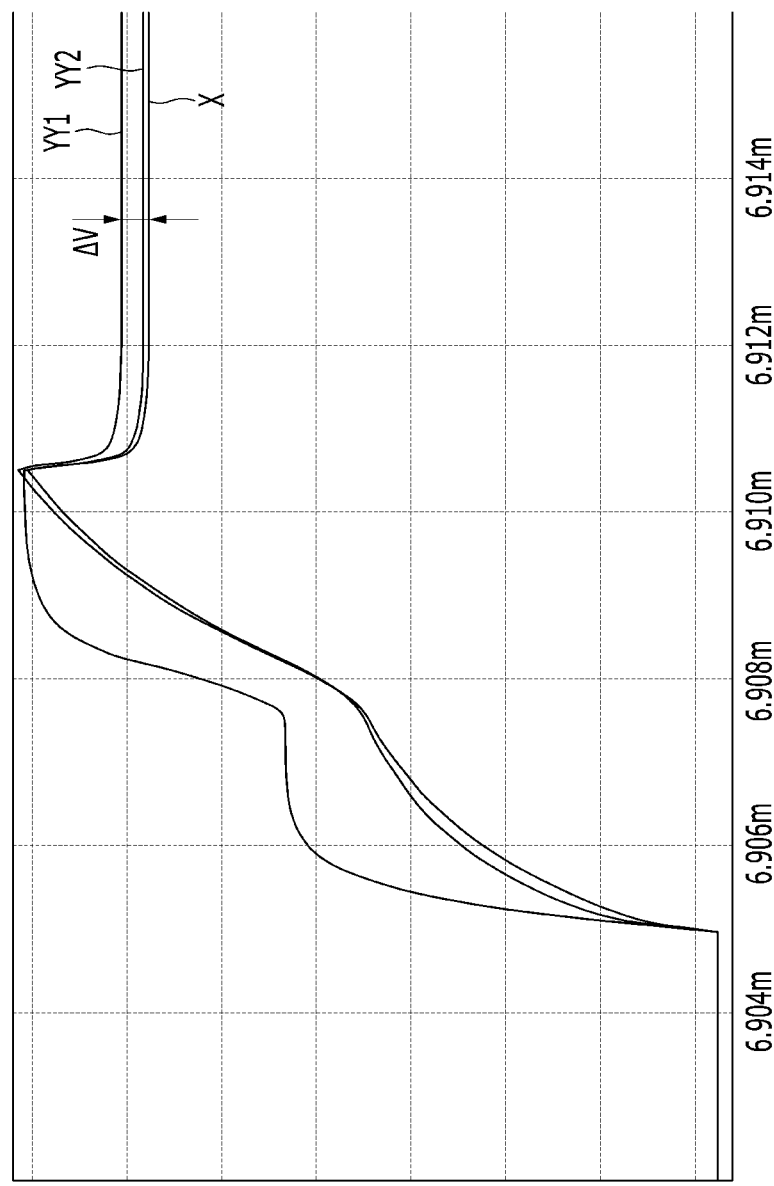
FIG. 18 is a graph illustrating results of another experimental example of an exemplary embodiment according to the invention.

Next, an experimental example according to another exemplary embodiment will be described with reference to FIG. 18. FIG. 18 is a graph illustrating results of an experimental example according to an exemplary embodiment.

In the experimental example, like the conventional LCD, for a first case X differentiating the magnitudes of the voltages applied to the first subpixel electrode 191a and the second subpixel electrode 191b by providing the gate line connected to the first switching element Qa and the second switching element Qb and the third switching element connected to the second drain electrode 175b, the change of the second voltage applied to the second subpixel electrode 191b is measured. Also, like the LCD according to an exemplary embodiment, for the second case providing the first resistor R1 or the second resistor R2 between the second source electrode 173b and the second drain electrode 175b and the third case providing the third resistor R3 between the data line 171 and the second source electrode 173b, the change of the second voltage applied to the second subpixel electrode 191b is measured. A result thereof is shown in FIG. 18.

As shown in FIG. 18, in the first case X, the second case YY1, and the third case YY2, the second voltage applied to the second subpixel electrode 191b is decreased over time. This phenomenon is called a kick-back phenomenon.

However, like the LCD according to an exemplary embodiment, in the second case YY1 and the third case YY2, since the resistor connected to the second subpixel electrode 191b interferes with the charge movement of the resistor, the movement of the charges charged to the second subpixel electrode 191b is also interfered with by the resistor. Accordingly, in the second case YY1 and the third case YY2 like the LCD according to an exemplary embodiment, compared with the first case X1 like the conventional LCD, it may be confirmed that the amount of the voltage drop due to the kick-back is reduced.

In this way, according to the LCD according to the illustrated exemplary embodiment, to decrease the magnitude of the voltage applied to the second subpixel electrode 191b without an additional TFT, by providing the resistor by using the gate conductor, the semiconductor, and the data conductor, the different voltages may be applied to the first subpixel electrode 191a and the second subpixel electrode 191b without further providing the TFT or the contact hole, while the side visibility may be close to the front visibility, a decrease of an aperture ratio of the LCD due to the TFT and the contact hole may be prevented and a voltage drop due to a kick-back phenomenon may be reduced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. A liquid crystal display comprising:
a first substrate;
a gate line and a data line disposed on the first substrate;
a first thin film transistor and a second thin film transistor connected to the gate line and the data line;
a first subpixel electrode connected to the first thin film transistor;
a first resistor connected to the second thin film transistor; and
a second subpixel electrode connected to the first resistor,
wherein the first resistor includes
a resistor input terminal connected to an output terminal of the second thin film transistor, and
a resistor output terminal connected to the second subpixel electrode,
a resistor semiconductor layer disposed under the resistor input terminal and output terminal,
a first resistor reference electrode disposed under the resistor semiconductor layer and overlapping the resistor input terminal; and a second resistor reference electrode disposed under the resistor semiconductor layer and overlapping the resistor output terminal.

2. The liquid crystal display of claim 1, wherein
a part of an edge of the resistor input terminal and the resistor output terminal overlaps at least part of an edge of the resistor semiconductor layer.

3. The liquid crystal display of claim 1, wherein the resistor emiconductor layer comprises a first portion not overlapping the resistor input terminal and the resistor output terminal, and the first resistor reference electrode and the second resistor reference electrode do not overlap the first portion of the resistor semiconductor layer.

4. The liquid crystal display of claim 3, wherein the first resistor reference electrode and the second resistor reference electrode are spaced from each other.

5. A liquid crystal display comprising:
a first substrate;
a gate line and a data line disposed on the first substrate;
a first thin film transistor and a second thin film transistor connected to the gate line and the data line;
a first subpixel electrode connected to the first thin film transistor;
a first resistor connected to the second thin film transistor;
a second subpixel electrode connected to the first resistor
a resistor reference voltage line disposed on the first substrate, and
the first resistor includes a first resistor capacitor and a second resistor capacitor connected to the resistor reference voltage line.

6. The liquid crystal display of claim 5, wherein
the resistor reference voltage line is applied with a reference voltage of a predetermined magnitude, and the predetermined magnitude of the reference voltage is larger than a magnitude of a data voltage applied to the data line.

7. The liquid crystal display of claim 6, wherein
one terminal connected to the first resistor capacitor and the second resistor capacitor is connected to the resistor reference voltage line,
the other terminal of the first resistor capacitor is connected to the resistor input terminal, and
the other terminal of the second resistor capacitor is connected to the resistor output terminal.

8. The liquid crystal display of claim 6, wherein
the resistor reference voltage line includes the first resistor reference electrode and the second resistor reference electrode.

9. The liquid crystal display of claim 8, wherein
an edge of the resistor reference electrode and an edge of the resistor semiconductor layer are overlapped with each other, and
a part of an edge of the resistor input terminal and the resistor output terminal overlaps at least part of the edge of the resistor reference electrode and the edge of the resistor semiconductor layer.

10. A liquid crystal display comprising:
a first substrate;
a gate line and a data line disposed on the first substrate;
a first thin film transistor and a second thin film transistor connected to the gate line and the data line;
a first subpixel electrode connected to the first thin film transistor;
a first resistor connected to the second thin film transistor;
a second subpixel electrode connected to the first resistor;
a resistor reference voltage line disposed on the first substrate, and
the first resistor includes a first resistor capacitor and a second resistor capacitor connected to the resistor reference voltage line,
wherein the first resistor includes
a resistor input terminal connected to an output terminal of the second thin film transistor,
a resistor output terminal connected to the second subpixel electrode, and
a resistor semiconductor layer disposed under the resistor input terminal and output terminal.

11. The liquid crystal display of claim 10, wherein
the resistor reference voltage line is applied with a reference voltage of a predetermined magnitude, and the predetermined magnitude of the reference voltage is larger than a magnitude of a data voltage applied to the data line.

12. The liquid crystal display of claim 11, wherein
one terminal connected to the first resistor capacitor and the second resistor capacitor is connected to the resistor reference voltage line,
the other terminal of the first resistor capacitor is connected to the resistor input terminal, and
the other terminal of the second resistor capacitor is connected to the resistor output terminal.

13. A liquid crystal display comprising:
a first substrate;
a gate line and a data line disposed on the first substrate;
a first thin film transistor and a second thin film transistor connected to the gate line and the data line;
a first subpixel electrode connected to the first thin film transistor;
a second subpixel electrode connected to the second thin film transistor; and
a second resistor connected between the data line and the second thin film transistor,
wherein the second resistor includes
a resistor input terminal connected to the data line,
a resistor output terminal connected to an input terminal of the second thin film transistor,
a resistor semiconductor layer disposed under the resistor input terminal and the output terminal,
a first resistor reference electrode disposed under the resistor semiconductor layer and overlapping the resistor input terminal; and
a second resistor reference electrode disposed under the resistor semiconductor layer and overlapping the resistor output terminal.

14. The liquid crystal display of claim 13, wherein
a part of an edge of the resistor input terminal and the resistor output terminal overlaps at least part of an edge of the resistor semiconductor layer.

15. The liquid crystal display of claim 13, wherein the resistor semiconductor layer comprise a first portion not overlapping the resistor input terminal and the resistor output terminal, and the first resistor reference electrode and the second resistor reference electrode do not overlap the first portion of the resistor semiconductor layer.

16. The liquid crystal display of claim 13, wherein the first resistor reference electrode and the second resistor reference electrode are spaced from each other.

* * * * *